US010425037B2

United States Patent
(12) United States Patent
Abe et al.

(10) Patent No.: US 10,425,037 B2
(45) Date of Patent: Sep. 24, 2019

(54) OSCILLATOR

(71) Applicant: NIHON DEMPA KOGYO CO., LTD., Tokyo (JP)

(72) Inventors: Tomonori Abe, Saitama (JP); Masahiro Mizoguchi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 44 days.

(21) Appl. No.: 15/572,783

(22) PCT Filed: Mar. 17, 2016

(86) PCT No.: PCT/JP2016/058479
§ 371 (c)(1),
(2) Date: Nov. 9, 2017

(87) PCT Pub. No.: WO2016/163218
PCT Pub. Date: Oct. 13, 2016

(65) Prior Publication Data

US 2018/0123512 A1 May 3, 2018

(30) Foreign Application Priority Data

Apr. 7, 2015 (JP) ................................ 2015-078358

(51) Int. Cl.
*H03B 5/32* (2006.01)
*H03B 25/00* (2006.01)
*H03B 1/04* (2006.01)

(52) U.S. Cl.
CPC ................ *H03B 1/04* (2013.01); *H03B 5/32* (2013.01); *H03B 25/00* (2013.01); *H03B 2200/0026* (2013.01)

(58) Field of Classification Search
CPC ... H03B 1/04; H03B 5/30; H03B 5/32; H03B 5/36; H03B 5/362; H03B 5/364; H03B 5/366; H03B 25/00; H03B 2200/0026
(Continued)

(56) References Cited

U.S. PATENT DOCUMENTS 6,229,249 B1 * 5/2001 Hatanaka ................ H03B 5/04 310/348
7,764,138 B2 * 7/2010 Harima ............... H03H 9/0547 331/158
(Continued)

FOREIGN PATENT DOCUMENTS

JP 2010109882 5/2010
JP 2014236466 12/2014
(Continued)

OTHER PUBLICATIONS

"International Search Report (Form PCT/ISA/210) of PCT/JP2016/058479", dated Jun. 7, 2016, with English translation thereof, pp. 1-2.

*Primary Examiner* — Levi Gannon
(74) *Attorney, Agent, or Firm* — JCIPRNET

(57) ABSTRACT

To reduce interference between wiring patterns at an oscillator that outputs a plurality of oscillation signals. An oscillator includes an IC configured to output a plurality of oscillation signals using a crystal resonator, and a base plate connected to the IC. The base plate includes a crystal resonator land and a crystal resonator land that are electrically connected to the crystal resonator, a power source land electrically connected to a power source, and a first output land positioned between the crystal resonator land and the power source land to output a first oscillation signal from the IC to an outside, and a wiring pattern from the first output land passes through between the crystal resonator land and the crystal resonator land.

8 Claims, 6 Drawing Sheets

(58) Field of Classification Search
USPC .................................................. 331/154, 158
See application file for complete search history.

(56) References Cited

U.S. PATENT DOCUMENTS

| | | | | |
|---|---|---|---|---|
| 2006/0238264 | A1* | 10/2006 | Hatanaka | H03L 1/04 331/158 |
| 2007/0075796 | A1* | 4/2007 | Mizumura | H03B 5/04 331/158 |
| 2012/0176763 | A1* | 7/2012 | Asamura | H03B 5/364 361/820 |
| 2014/0361842 | A1* | 12/2014 | Chen | H03B 5/36 331/44 |
| 2015/0123737 | A1* | 5/2015 | Yokoo | H03H 9/0552 331/34 |

FOREIGN PATENT DOCUMENTS

| | | |
|---|---|---|
| JP | 2015010302 | 1/2015 |
| JP | 2015019302 | 1/2015 |

* cited by examiner

| | TERMINAL 922a | TERMINAL 922b | TERMINAL 922d | TERMINAL 922f | TERMINAL 922e |
|---|---|---|---|---|---|
| TERMINAL 922a | | 0.215 | 0.077 | 0.051 | 0.073 |
| TERMINAL 922b | | | 0.050 | 0.029 | 0.040 |
| TERMINAL 922d | | | | 0.072 | 0.090 |
| TERMINAL 922f | | | | | 0.179 |
| TERMINAL 922e | | | | | |

FIG. 6

| | TERMINAL 22a | TERMINAL 22b | TERMINAL 22d | TERMINAL 22f | TERMINAL 22e |
|---|---|---|---|---|---|
| TERMINAL 22a | | 0.161 | 0.027 | 0.023 | 0.065 |
| TERMINAL 22b | | | 0.012 | 0.018 | 0.058 |
| TERMINAL 22d | | | | 0.008 | 0.020 |
| TERMINAL 22f | | | | | 0.112 |
| TERMINAL 22e | | | | | |

FIG. 7

OSCILLATOR

CROSS-REFERENCE TO RELATED APPLICATION

This application is a 371 application of the international PCT application serial no. PCT/JP2016/058479, filed on Mar. 17, 2016, which claims the priority benefits of Japan application No. 2015-078358, filed on Apr. 7, 2015. The entirety of each of the above-mentioned patent applications is hereby incorporated by reference herein and made a part of this specification.

TECHNICAL FIELD

The present invention relates to an oscillator configured to output a plurality of oscillation signals at an oscillator circuit using a crystal resonator.

BACKGROUND ART

Electronic equipment uses a timing device that continues to supply stable oscillation signals having a predetermined period. As such timing device, an oscillator using a crystal resonator is widely prevalent. Recently, as the oscillator, as described in following Patent Document 1, a dual-mode oscillator that outputs two oscillation signals with one quartz crystal piece is proposed.

CITATION LIST

Patent Document

Patent Document 1: Japanese Unexamined Patent Application Publication No. 2014-236466

SUMMARY

Problems to be Solved

At the oscillator that outputs a plurality of oscillation signals, the number of wiring patterns in a substrate increases, thus complicating the wiring. Then, when a plurality of wiring patterns is wired so as to be adjacent in a limited space, binding of capacitance increases between terminals to which the respective wiring patterns are connected, thus generating interference between the wiring patterns. This possibly results in degradation of frequency characteristic of the oscillator.

Therefore, the present invention has been made in consideration of these points, and it is an object of the present invention to reduce interference between wiring patterns at an oscillator that outputs a plurality of oscillation signals.

Solutions to the Problems

A first aspect of the present invention provides an oscillator that includes an oscillator circuit and a substrate. The oscillator circuit is configured to output a plurality of oscillation signals using a crystal resonator. The substrate is connected to the oscillator circuit. The substrate includes a first crystal resonator land and a second crystal resonator land that are electrically connected to the crystal resonator, a power source land electrically connected to a power source, and a first output land positioned between the first crystal resonator land and the power source land to output a first oscillation signal from the oscillator circuit to an outside. A wiring pattern from the first output land passes through between the first crystal resonator land and the second crystal resonator land.

The oscillator may be configured as follows. The first crystal resonator land, the second crystal resonator land, the power source land, and the first output land are formed on a principal surface of the substrate. On the principal surface, the wiring pattern from the first output land is formed at a first side with respect to a virtual line that connects the first crystal resonator land to the power source land, and a wiring pattern from the power source land is formed at a second side opposed to the first side with respect to the virtual line.

The oscillator may be configured as follows. On the principal surface of the substrate, a distance between the wiring pattern from the first output land and a wiring pattern from the power source land has a size equal to or more than a distance between the first output land and the power source land.

The oscillator may be configured as follows. The oscillator further includes a second output land that outputs a second oscillation signal different from the first oscillation signal to the outside. The power source land is positioned between the first output land and the second output land. On the principal surface of the substrate, a distance between a wiring pattern from the second output land and a wiring pattern from the power source land has a size equal to or more than a distance between the second output land and the power source land.

Effects of The Invention

The present invention provides an effect that can reduce the interference between the wiring patterns at the oscillator that outputs the plurality of oscillation signals.

BRIEF DESCRIPTION OF THE DRAWINGS

FIG. 6 shows the binding values of the capacitance between the crystal resonator terminal 922*a*, the first output terminal 922*b*, the second output terminal 922*d*, the third output terminal 922*f*, and the crystal resonator terminal 922*e* of the oscillator of the comparative example.

FIG. 7 shows the binding values of the capacitance between the crystal resonator terminal 22*a*, the first output terminal 22*b*, the second output terminal 22*d*, the third output terminal 22*f*, and the crystal resonator terminal 22*e* of the oscillator 1 of the embodiment.

DESCRIPTION OF EMBODIMENTS

<Configuration of Oscillator>

Figure 1:
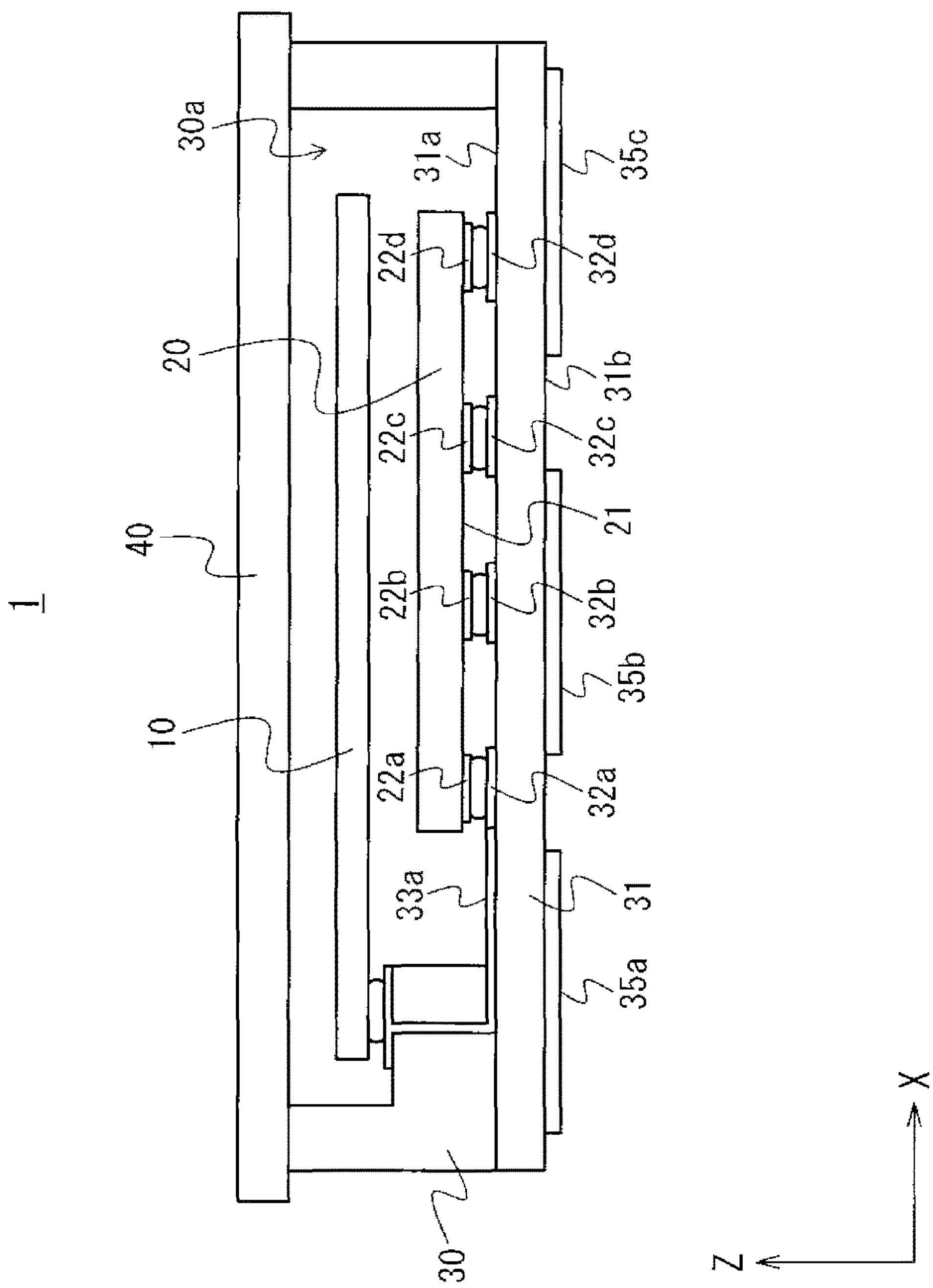
FIG. 1 is a view illustrating a configuration of an oscillator 1 according to one embodiment of the present invention.

A description will be given of an exemplary configuration of an oscillator 1 according to one embodiment of the present invention by referring to FIG. 1. FIG. 1 is a view illustrating the configuration of the oscillator 1 according to the one embodiment.

The oscillator 1, which is configured to be mounted on various electronic equipment such as portable equipment, is a timing device that continues to supply stable oscillation signals having a predetermined frequency at an oscillator circuit using a crystal resonator. The oscillator 1 according to the embodiment is configured to output a plurality of oscillation signals having different frequencies (here, an oscillation signal corresponding to 30 MHz and an oscillation signal corresponding to 25 MHz).

As illustrated in FIG. 1, the oscillator 1 includes a crystal resonator 10, an IC 20, a base member 30, and a cover member 40. The crystal resonator 10 has, for example, a structure that sandwiches a crystal element that is a piezoelectric body by two electrodes. The two electrodes are each electrically connected to the IC 20. The crystal resonator 10 is housed in a depressed portion 30*a* of the base member 30.

The IC 20 forms an electronic circuit to have a function of an oscillator circuit that outputs a first oscillation signal corresponding to 30 MHz (a first frequency) and a second oscillation signal corresponding to 25 MHz (a second frequency) using the crystal resonator 10. The IC 20 is housed in the depressed portion 30*a* of the base member 30 so as to be positioned below the crystal resonator 10. The IC 20 includes a plurality of terminals on a lower surface 21 opposed to a base plate 31 of the base member 30. The terminals of the IC 20 are each connected to lands formed on the base plate 31.

Figure 2:
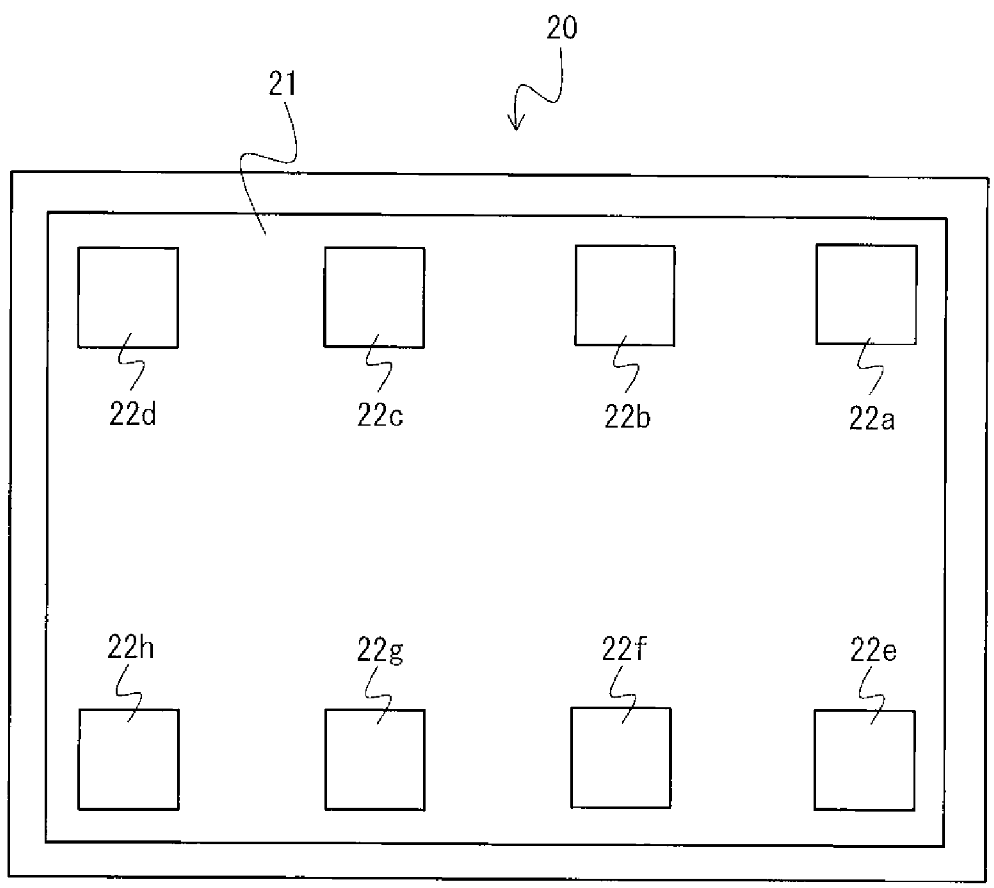
FIG. 2 is a schematic diagram illustrating an arrangement state of terminals of an IC 20.

FIG. 2 is a schematic diagram illustrating an arrangement state of the terminals of the IC 20, and a view of the IC 20 viewed from a side of the lower surface 21. As illustrated in FIG. 2, on the lower surface 21 of the IC 20, a crystal resonator terminal 22*a*, a first output terminal 22*b*, a power source terminal 22*c*, a second output terminal 22*d*, a crystal resonator terminal 22*e*, a third output terminal 22*f*, a switch terminal 22*g*, and an earth/ground terminal 22*h* are formed.

The crystal resonator terminal 22*a* is a terminal electrically connected to the electrode of the crystal resonator 10. The first output terminal 22*b* is a terminal for outputting the first oscillation signal with 30 MHz. The power source terminal 22*c* is a terminal electrically connected to the power source. The second output terminal 22*d* is a terminal for outputting the second oscillation signal with 25 MHz.

The crystal resonator terminal 22*e* is a terminal electrically connected to the electrode of the crystal resonator 10. The third output terminal 22*f* is, here, a terminal for selecting and outputting one of the first oscillation signal with 30 MHz and the second oscillation signal with 25 MHz. The switch terminal 22*g* is a terminal for switching the oscillation signal (the first oscillation signal or the second oscillation signal) outputted from the third output terminal 22*f* The earth/ground terminal 22*h* is a terminal for earthing/grounding the IC 20.

As illustrated in FIG. 2, the crystal resonator terminal 22*a*, the first output terminal 22*b*, the power source terminal 22*c*, and the second output terminal 22*d* are arranged in line at predetermined intervals along a long side direction (an X direction) of the IC 20. Similarly, the crystal resonator terminal 22*e*, the third output terminal 22*f*, the switch terminal 22*g*, and the earth/ground terminal 22*h* are also arranged in line at predetermined intervals along the long side direction of the IC 20. Intervals of the terminals in a short side direction (a Y direction) of the IC 20 have identical sizes.

Referring again to FIG. 1, the base member 30 has, for example, a structure where a ceramic that is a base material is laminated. The base member 30 is a container where the depressed portion 30*a* is formed at a center. The depressed portion 30*a* houses the crystal resonator 10 and the IC 20. The base member 30, which has the base plate 31 on which wiring patterns are formed, is connected to the IC 20.

Figure 3:
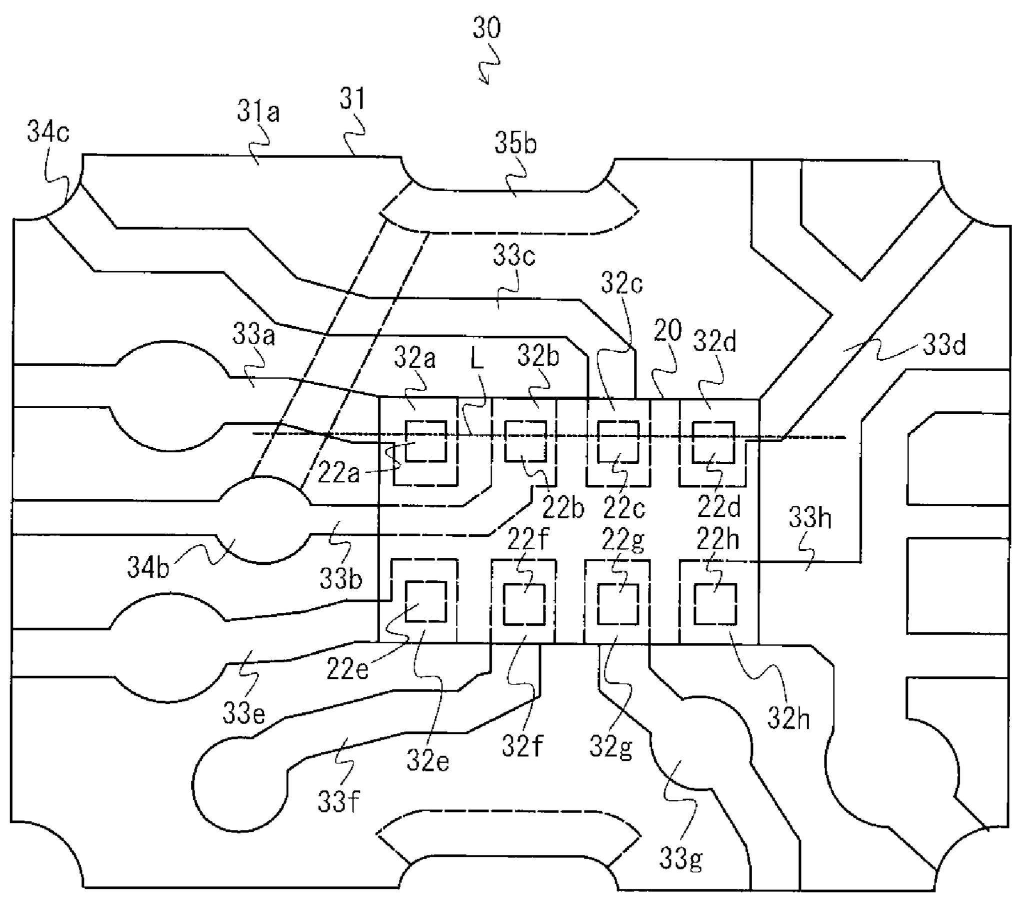
FIG. 3 is a schematic diagram illustrating a wiring state of wiring patterns and lands that are formed on a base plate 31.

FIG. 3 is a schematic diagram illustrating a wiring state of the wiring patterns and lands formed on the base plate 31. As illustrated in FIG. 3, wiring patterns 33*a* to 33*h* are formed on a top surface 31*a* of the base plate 31 of the base member 30. On the top surface 31*a*, a crystal resonator land 32*a*, a first output land 32*b*, a power source land 32*c*, a second output land 32*d*, a crystal resonator land 32*e*, a third output land 32*f*, a switch land 32*g*, and an earth/ground land 32*h* are formed. In the embodiment, the top surface 31*a* corresponds to a principal surface of the base member 30, the crystal resonator land 32*a* corresponds to a first crystal resonator land, and the crystal resonator land 32*e* correspond to a second crystal resonator land.

The crystal resonator land 32*a* is formed on an end portion of the wiring pattern 33*a* to be bonded to the crystal resonator terminal 22*a* of the IC 20. For example, the crystal resonator land 32*a* is bonded to the crystal resonator terminal 22*a* by an Au bump as illustrated in FIG. 1. The first output land 32*b* is formed on an end portion of the wiring pattern 33*b* to be bonded to the first output tenninal 22*b* of the IC 20. The power source land 32*c* is formed on an end portion of the wiring pattern 33*c* to be bonded to the power source tenninal 22*c* of the IC 20. The second output land 32*d* is formed on an end portion of the wiring pattern 33*d* to be bonded to the second output terminal 22*d* of the IC 20.

The crystal resonator land 32*e* is formed on an end portion of the wiring pattern 33*e* to be bonded to the crystal resonator tenninal 22*e* of the IC 20. The third output land 32*f* is formed on an end portion of the wiring pattern 33*f* to be bonded to the third output terminal 22*f* of the IC 20. The switch land 32*g* is formed on an end portion of the wiring pattern 33*g* to he bonded to the switch terminal 22*g* of the IC 20. The earth/ground land 32*h* is formed on an end portion of the wiring pattern 33*h* to be bonded to the earth/ground terminal 22*h* of the IC 20.

According to the embodiment, the crystal resonator land 32*a* and the crystal resonator land 32*e* are electrically connected to the terminals of the crystal resonator 10 via wiring patterns 33*a*, 33*e* respectively (see FIG. 1). The power source land 32*c* is electrically connected to the power source via the wiring pattern 33*c*. The first output land 32*b*, the second output land 32*d*, and the third output land 32*f* are electrically connected to external terminals disposed on a back surface 31*b* (FIG. 1) of the base plate 31 to output the oscillation signals to an outside via the wiring patterns 33*b*, 33*d*, and 33*f* respectively. For example, the wiring pattern 33*b* is connected to an external terminal 35*b*, and the wiring pattern 33*d* is connected to an external terminal 35*c*. Then, the first output land 32*b* outputs the first oscillation signal with 30 MHz from the oscillator circuit of the IC 20. The second output land 32*d* outputs the second oscillation signal with 25 MHz, The third output land 32*f* outputs the first oscillation signal with 30 MHz or the second oscillation signal with 25 MHz.

Incidentally, in the embodiment, the wiring pattern 33*b* from the first output land 32*b* is formed so as to separate from the wiring pattern 33*c* from the power source land 32*c* disposed next to the first output land 32*b*. Specifically, on the top surface 31*a*, a distance between the wiring pattern 33*b* from the first output land 32*b* and the wiring pattern 33*c* from the power source land 32c has a size equal to or more than a distance between the first output land 32b and the power source land 32c. This can prevent the wiring pattern 33b and the wiring pattern 33c from getting close to reduce interference between the wiring pattern 33b and the wiring pattern 33c. This result ensures appropriate output of the first oscillation signal with 30 MHz output from the first output land 32b to the outside.

On the top surface 31a, the wiring pattern 33b from the first output land 32b is formed at a first side (a lower side in FIG. 3) with respect to a virtual line (a virtual line L illustrated in FIG. 3) that connects the first output land 32b to the power source land 32c, and the wiring pattern 33c from the power source land 32c is formed at a second side (an upper side in FIG. 3) opposed to the first side with respect to the virtual line L. Thus, a forming direction of the wiring pattern 33b and a forming direction of the wiring pattern 33c become opposite. This can effectively prevent the wiring pattern 33b and the wiring pattern 33c from getting close.

The wiring pattern 33b is formed so as to pass through between the crystal resonator land 32a and the crystal resonator land 32e. That is, the wiring pattern 33b is formed between the wiring pattern 33a from the crystal resonator land 32a and the wiring pattern 33e from the crystal resonator land 32e. In this case, the distance between the wiring pattern 33b and the wiring pattern 33c can be large. This can more effectively reduce the interference between the wiring pattern 33b and the wiring pattern 33c.

The wiring pattern 33b is wired to the back surface 31b of the base plate 31 via a through-hole 34b formed on the top surface 31a to be connected to the external terminal 35b disposed on the back surface 31b. On the other hand, the wiring pattern 33c is wired to the back surface 31b via a side surface 34c at a corner of the base plate 31 without a through-hole to be connected to an external terminal 35a disposed on the back surface 31b. This can prevent the wiring pattern 33b and wiring pattern 33c from getting close on the back surface 31b.

The wiring pattern 33d from the second output land 32d is also formed so as to separate from the wiring pattern 33c from the power source land 32c positioned between the first output land 32b and the second output land 32d. Specifically, on the top surface 31a, a distance between the wiring pattern 33d from the second output land 32d and the wiring pattern 33c from the power source land 32c has a size equal to or more than a distance between the second output land 32d and the power source land 32c. This can prevent the wiring pattern 33d and the wiring pattern 33c from getting close to reduce interference between the wiring pattern 33d and the wiring pattern 33c. This result ensures appropriate output of the second oscillation signal with 25 MHz to the outside, in addition to the first oscillation signal with 30 MHz.

Referring again to FIG. 1, the cover member 40 is bonded to the base member 30 to seal the depressed portion 30a of the base member 30. The cover member 40, which is formed into a flat plate shape, is bonded to the base member 30, for example, via a sealing material.

<Effect According to the Embodiment>

According to the embodiment, as illustrated in FIG. 3, the wiring pattern 33b from the first output land 32b that outputs the oscillation signal with 30 MHz and the wiring pattern 33d from the second output land 32d that outputs the oscillation signal with 25 MHz are formed so as to separate from the wiring pattern 33c from the power source land 32c positioned between the first output land 32b and the second output land 32d. This can reduce interference between the wiring patterns 33b, 33c, and 33d that is generated caused by close disposition of the first output land 32b, the power source land 32c, and the second output land 32d.

Figure 4:
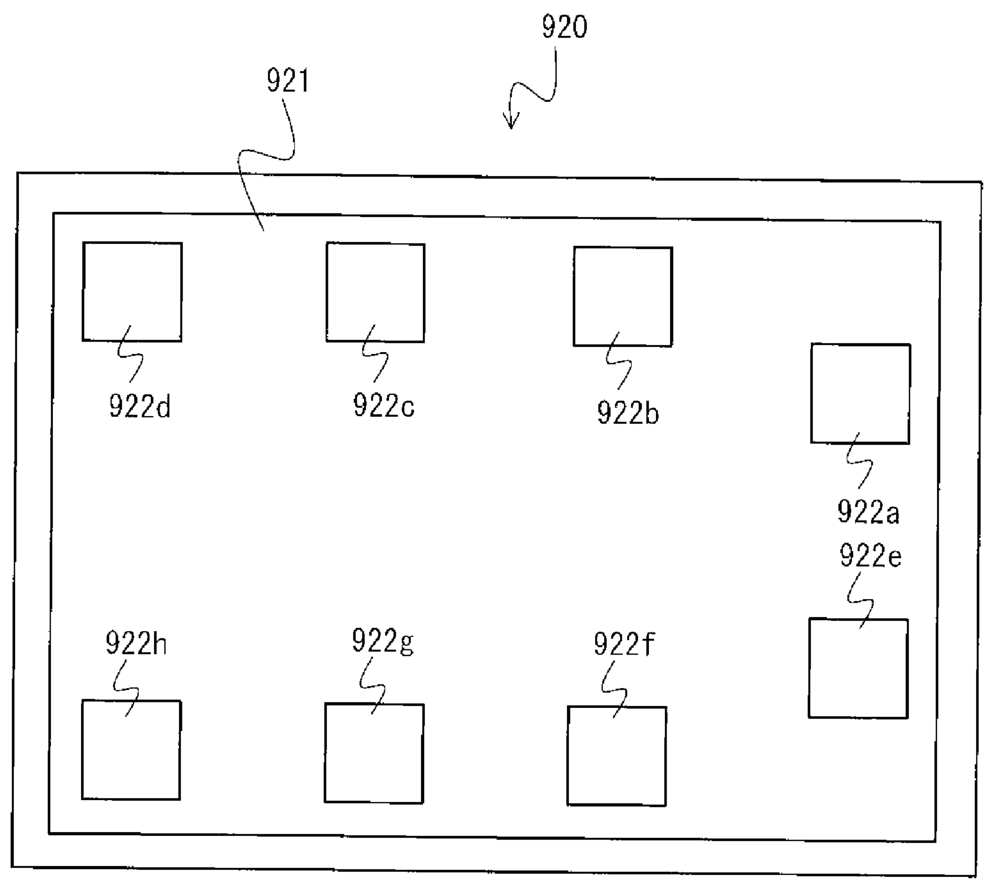
FIG. 4 is a schematic diagram illustrating an arrangement state of terminals of an IC 920 according to a comparative example.
Figure 5:
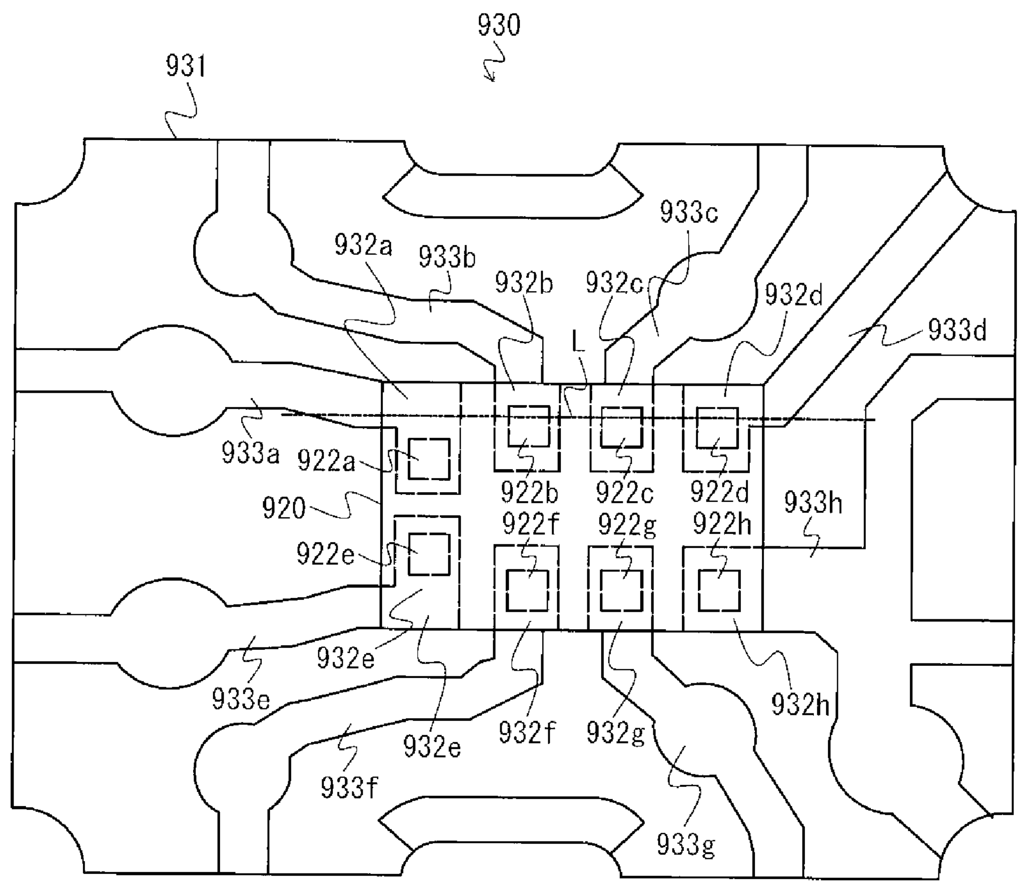
FIG. 5 is a schematic diagram illustrating a wiring state of wiring patterns and lands that are formed on a base plate 931 according to the comparative example.

The following further describes the effect according to the embodiment, compared with an oscillator according to a comparative example illustrated in FIG. 4 and FIG. 5. FIG. 4 is a schematic diagram illustrating an arrangement state of terminals of an IC 920 according to the comparative example, and a view of the IC 920 viewed from a side of a lower surface 921. FIG. 5 is a schematic diagram illustrating a wiring state of wiring patterns and lands formed on a base plate 931 of a base member 930 according to the comparative example.

As illustrated in FIG. 4, similarly to the IC 20 of the oscillator 1 illustrated in FIG. 2, the IC 920 also includes a crystal resonator terminal 922a, a first output terminal 922b, a power source terminal 922c, a second output terminal 922d, a crystal resonator terminal 922e, a third output terminal 922f, a switch tenninal 922g, and an earth/ground terminal 922h. At the IC 920, an interval between the crystal resonator terminal 922a and the crystal resonator terminal 922e in a short side direction (a Y direction) is smaller than the interval between the crystal resonator terminal 22a and the crystal resonator terminal 22e of the IC 20 illustrated in FIG. 2.

As illustrated in FIG. 5, also on the oscillator according to the comparative example, lands 932a to 932h bonded to the respective terminals of the IC 920 and wiring patterns 933a to 933h are formed. As understood by comparing FIG. 3 and FIG. 5, the wiring states of the wiring pattern 933b from the first output land 932b and the wiring pattern 933c from the power source land 932c are different from the wiring states of the wiring patterns 33b, 33c of the oscillator 1 illustrated in FIG. 3. Specifically, as illustrated in FIG. 5, the wiring patterns 933b, 933c are formed at an identical side (an upper side in FIG. 5) with respect to a virtual line L that connects the first output land 932b to the power source land 932c. The wiring pattern 933c is formed so as to be parallel to the wiring pattern 933d from the second output land 932d. Incidentally, in a case of the wiring where illustrated in FIG. 5, a binding value of capacitance between the terminals of the IC 920 increases.

Here, a description will be given of measurement results of the binding value of the capacitance between the terminals of the IC 920 of the oscillator according to the comparative example and a binding value of capacitance between the terminals of the IC 20 of the oscillator 1 according to the embodiment. Typically, the larger the binding value of the capacitance between the terminals is, the larger a degree of the interference between the wiring patterns is. Especially, if the binding value increases, a waveform of the oscillation signal output via the wiring pattern distorts. Thus, the oscillation signal having a normal waveform possibly cannot be output.

FIG. 6 shows the binding values of the capacitance between the crystal resonator terminal 922a, the first output terminal 922b, the second output terminal 922d, the third output terminal 922f, and the crystal resonator terminal 922e of the oscillator of the comparative example. A unit of the binding value is pF.

FIG. 7 shows the binding values of the capacitance between the crystal resonator terminal 22a, the first output terminal 22b, the second output terminal 22d, the third output terminal 22f, and the crystal resonator terminal 22e of the oscillator 1 of the embodiment.

As understood by comparing above-described FIG. 6 and FIG. 7, in the case of the embodiment, compared with the comparative example, generally, the binding values of the capacitance between the terminals are small. The decrease of the binding value can reduce distortion of the waveform of the output oscillation signal. Thus, the oscillator 1 can output a normal oscillation signal. In the case of the embodiment, the interference between the wiring patterns 33*a*, 33*b*, 33*d*, 33*f*, and 33*e* corresponding to the crystal resonator terminal 22*a*, the first output terminal 22*b*, the second output terminal 22*d*, the third output terminal 22*f*, and the crystal resonator terminal 22*e* respectively also decreases to ensure improvement of the characteristic of the oscillator 1.

While the present invention has been described above with reference to the embodiment, the technical scope of the present invention is not limited to the scope of the embodiment described above. It is apparent that a variety of variations and modifications of the above-described embodiment can be made by those skilled in the art. It is apparent from accompanying claims that such variations and modifications may also be encompassed by the technical scope of the present invention.

The invention claimed is:

1. An oscillator, comprising:

an oscillator circuit, configured to output a plurality of oscillation signals using a crystal resonator; and a substrate, connected to the oscillator circuit, wherein the substrate includes:

a first crystal resonator land and a second crystal resonator land that are electrically connected to the crystal resonator;

a power source land, electrically connected to a power source; and a first output land, positioned between the first crystal resonator land and the power source land to output a first oscillation signal from the oscillator circuit to an outside, wherein, a first wiring pattern from the first output land is wired toward a direction and passes through between the first crystal resonator land and the second crystal resonator land, and a second wiring pattern from the power source land is wired toward the direction.

2. The oscillator according to claim 1, wherein the first crystal resonator land, the second crystal resonator land, the power source land, and the first output land are formed on a principal surface of the substrate, and on the principal surface, the first wiring pattern from the first output land is formed at a first side with respect to a virtual line that connects the first crystal resonator land to the power source land, and the second wiring pattern from the power source land is formed at a second side opposed to the first side with respect to the virtual line.

3. The oscillator according to claim 1, wherein on a principal surface of the substrate, a distance between the first wiring pattern from the first output land and the second wiring pattern from the power source land has a size equal to or more than a distance between the first output land and the power source land.

4. The oscillator according to claim 1, further comprising:

a second output land that outputs a second oscillation signal different from the first oscillation signal to the outside, wherein the power source land is positioned between the first output land and the second output land, and on a principal surface of the substrate, a distance between a wiring pattern from the second output land and the second wiring pattern from the power source land has a size equal to or more than a distance between the second output land and the power source land.

5. The oscillator according to claim 2, wherein on a principal surface of the substrate, a distance between the first wiring pattern from the first output land and the second wiring pattern from the power source land has a size equal to or more than a distance between the first output land and the power source land.

6. The oscillator according to claim 2, further comprising:

a second output land that outputs a second oscillation signal different from the first oscillation signal to the outside, wherein the power source land is positioned between the first output land and the second output land, and on a principal surface of the substrate, a distance between a wiring pattern from the second output land and the second wiring pattern from the power source land has a size equal to or more than a distance between the second output land and the power source land.

7. The oscillator according to claim 3, further comprising:

a second output land that outputs a second oscillation signal different from the first oscillation signal to the outside, wherein the power source land is positioned between the first output land and the second output land, and on a principal surface of the substrate, a distance between a wiring pattern from the second output land and the second wiring pattern from the power source land has a size equal to or more than a distance between the second output land and the power source land.

8. The oscillator according to claim 5, further comprising:

a second output land that outputs a second oscillation signal different from the first oscillation signal to the outside, wherein the power source land is positioned between the first output land and the second output land, and on a principal surface of the substrate, a distance between a wiring pattern from the second output land and the second wiring pattern from the power source land has a size equal to or more than a distance between the second output land and the power source land.

* * * * *